(12) United States Patent
Pessoa et al.

(10) Patent No.: US 7,869,609 B2
(45) Date of Patent: Jan. 11, 2011

(54) BOUNDED SIGNAL MIXER AND METHOD OF OPERATION

(75) Inventors: Lucio F. C. Pessoa, Cedar Park, TX (US); Kim-Chyan Gan, Redmond, WA (US)

(73) Assignee: Freescale Semiconductor, Inc., Austin, TX (US)

( * ) Notice: Subject to any disclaimer, the term of this patent is extended or adjusted under 35 U.S.C. 154(b) by 1542 days.

(21) Appl. No.: 11/209,157

(22) Filed: Aug. 22, 2005

(65) Prior Publication Data

US 2007/0083580 A1  Apr. 12, 2007

(51) Int. Cl.
*H04B 1/00* (2006.01)
*G06F 17/00* (2006.01)
*G06F 7/00* (2006.01)
*H04B 1/20* (2006.01)

(52) U.S. Cl. .............................. 381/119; 700/94; 369/4; 708/200

(58) Field of Classification Search ......... 704/500–504; 381/106, 119; 348/E5.056
See application file for complete search history.

(56) References Cited

U.S. PATENT DOCUMENTS

| | | | |
|---|---|---|---|
| 4,006,353 A | | 2/1977 | Pierce |
| 4,275,268 A | | 6/1981 | Takahashi et al. |
| 4,787,056 A | * | 11/1988 | Dieterich ............. 708/606 |
| 4,993,073 A | * | 2/1991 | Sparkes ............. 381/119 |
| 5,041,998 A | | 8/1991 | Lawrence et al. |
| 5,436,899 A | * | 7/1995 | Fujino et al. ............. 370/433 |
| 5,768,126 A | * | 6/1998 | Frederick ............. 700/94 |
| 6,041,080 A | | 3/2000 | Fraisse |

OTHER PUBLICATIONS

Author: Toth; Title: "Mixing Digital Audio"; Date: Aug. 14, 2000; IDS: A later dated version of this was cited on the applicant's IDS dated Aug. 22, 2005 URL: http://web.archive.org/web/20001002212555/http://www.vttoth.com/digimix.htm.*
Author: Lomax; Title: "VB & VBA in a Nutshell: The Language"; Date: Oct. 9, 2009; Publisher: O'Reilly Media, Inc.; Pertinent: Section: The Language Reference, Part 3: Get Statement-PV Function> PV Function > IIF Function; URL: http://proquest.safaribooksonline.com/1565923588/vbanut-ch-07c?refview=I#ch07-1236-fm2xml.*

(Continued)

*Primary Examiner*—Lewis A Bullock, Jr.
*Assistant Examiner*—Joseph Kelly
(74) *Attorney, Agent, or Firm*—James L. Clingan, Jr.; Daniel D. Hill

(57) ABSTRACT

A method and apparatus are provided for mixing a plurality of signals within a predetermined dynamic range without clipping. In the method and apparatus, first and second signal samples are added together to obtain a first intermediate result. Then the first signal sample is multiplied with the second signal sample to obtain a second intermediate result. In one embodiment, the second intermediate result is subtracted from the first intermediate result to obtain a third intermediate result, and the third intermediate result is discarded if the third intermediate result is less than zero. In another embodiment, the second intermediate result is added to the first intermediate result to obtain the third intermediate result, and the third intermediate result is discarded if the third intermediate result is greater than zero. An output signal sample is provided based on the third intermediate result.

22 Claims, 1 Drawing Sheet

OTHER PUBLICATIONS

Author: Balter; Title: "Mastering Access 97 Development, Second Edition"; Date: Jan. 17, 1997; Publisher: Sams; Pertinent: Ch. 8 Sect. 6, Header "Immediate IF"; URL: http://proquest.safaribooksonline.com/0672309998/ch08lev1sec6?displaygrbooks=0.*

Author: Wikipedia; Title: "Conditional (programming)"; Date: May 5, 2005—Date is not good, but the program/subject matter it describes dates back to at latest 1997; Pertinent: Section "As a function"; URL:http://en.wikipedia.org/w/index.php?title=Conditional_(programming)&oldid=287954469.*

Author: Wikipedia; Title: "Heaviside step function"; Date: Aug. 8, 2004; URL: http://en.wikipedia.org/wiki/Heaviside_step_function.*

Uskokovic et al, "The Implementation of Digital Audio Processors in Analog Multimedia Audio Systems", 17$^{th}$ International Conference on Applied Electromagnetics and Communications, Oct. 1-3, 2003, Croatia.

Toth, "Technical Notes: Mixing Digital Audio", http://www.vttoth.com/digimix.htm, Nov. 16, 2004.

Yu et al, " Linear PCM Signal Processing for Audio Processing Unit in Multipoint Video Conferencing System", ETRI, Network Architecture Section, Korea.

Thomson et al, "A Digitally Controlled 8-Input/2-Output Audio Mixer IC", pp. 1193-1196, IEEE, 1996, USA.

* cited by examiner

BOUNDED SIGNAL MIXER AND METHOD OF OPERATION

FIELD OF THE INVENTION

This invention relates to mixers, and more particularly to mixers that provide a bounded signal.

BACKGROUND OF THE INVENTION

Many communications systems have a limited dynamic range so that bounded signals are preferably provided. Such signals are bounded to be within the dynamic range. In practice this has been difficult to achieve because of the variations in factors that can result in the need for various signal strengths. In some applications two or more signals are combined and then transmitted. Each of the signals may be within the dynamic range but the combination is not. Another application arises when there is a need to amplify a source signal to achieve a target signal to noise ratio. After providing the requisite amplification, the result amplified signal may be outside the dynamic range. Most approaches result in some clipping of the signal upon actual transmission. The transmission channel itself forces the clipping and results in distortion at the receiving end. In the case of voice transmission, clipping generally results in a very unpleasant sound and often a significant reduction in intelligibility. In the case of image or video transmission, clipping results in loss of fidelity and overexposure. Other approaches require an extra supporting circuitry and can still result in the loss of information. For example, two signals can be combined to result in a 16 bit digital signal but be transmitted at a reduced number of bits as a bounded signal due to the limited dynamic range of the transmission channel. This requires additional circuitry for the combining and results in the loss of data after being bounded to the dynamic range of the transmission channel.

Thus there is a need for a circuit technique that provides for a bounded signal that avoids one or more of the problems described above.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings.

DETAILED DESCRIPTION OF THE INVENTION

In one aspect a mixer kernel combines two signals, which are themselves bounded, in a way that the resulting combined signal is bounded as well. The resulting combined signal is ensured of being no greater magnitude than the largest of the incoming signals that are to be combined. This approach normalizes the incoming signals to plus and minus one for the full dynamic range so that the signal magnitudes that are mixed each have an absolute value that is less than or equal to one. The result is that the character of the combined signal is compressed into the dynamic range. The resulting sound of the combined signal is more pleasant to the listener as well as being of higher intelligibility. This is better understood by reference to the drawings and the following description.

Figure 1:
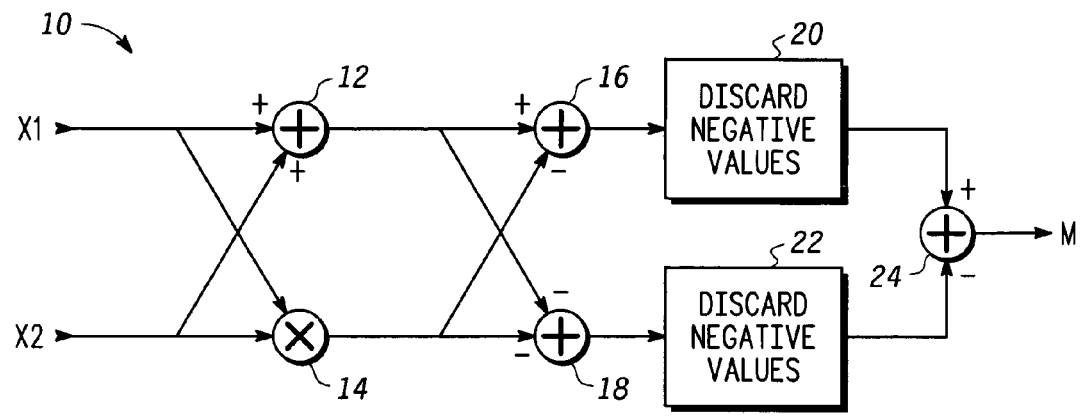
FIG. 1 is a circuit diagram of a mixing kernel according to one embodiment.

Shown in FIG. 1 is a mixing kernel 10 comprising an adder 12, a multiplier 14, an adder 16, an adder 18, a discard negative values circuit 20, a discard negative values circuit 22, and an adder 24. Adders 12, 16, 18, and 24 and multiplier 14 are shown as separate elements and may be implemented in that fashion or as a part of processing system that uses various circuit elements for a desired function under the control of software. Adder 12 has an adding input for receiving signal X1, an adding input for receiving signal X2, and an output. Multiplier 14 has an input for receiving signal X1, an input for receiving signal X2, and an output. Adder 16 has an adding input coupled to the output of adder 12, a negating input coupled to the output of multiplier 14, and an output. Adder 18 has a negating input coupled to the output of adder 12, a negating input coupled to the output of multiplier 14, and an output. Discard negative values circuit 20 has an input coupled to the output of adder 16 and has an output. Discard negative values circuit 22 has an input coupled to the output of adder 18 and has an output. Adder 24 has an adding input coupled to the output discard negative values circuit 20, a negating input coupled to the output of discard negative values circuit 22, and an output that provides a mixed signal M. At any given point in time, signals X1 and X2 are a sample of a time varying signal such as voice signal and are digital signals that have been normalized so that their maximum absolute value is one. Any absolute value less than one is represented as a fractional value between plus and minus one. Plus and minus one also represents the dynamic range available for transmission of mixed signal M.

In operation, adder 12 provides an intermediate result on its output of X1 plus X2;

X1+X2.

Multiplier 14 provides an intermediate result on its output of X1 times X2;

X1X2.

Adder 16 thus provides an intermediate result on its output of X1 plus X2 minus X1 times X2;

X1+X2−X1X2.

Adder 18 provides an intermediate result on its output of minus X1 minus X2 minus X1 times X2;

−X1−X2−X1X2.

Discard negative values circuit 20 couples the output of adder 16 to the adding input 24 if it is positive and otherwise couples zero to adder 24. Similarly, discard negative values circuit 22 couples the output of adder 18 to the negating input of adder 24 if the value of its output is positive and otherwise couples a zero value to adder 24. This can be viewed as multiplying the input by a step function of the input. Accordingly, discard negative values circuits 20 and 22 each include a step function circuit. For example, if X1 is 1 and X2 is minus one, then the output of adder 16 is 1−1−(−1)1=1, which is positive, and is coupled to the adding input of adder 24, and the output of adder 18 is −(−1)−1−(−1)1=1, which is positive, and is coupled to the negating input of adder 44. With the adding input and negating input of adder 24 both at plus 1, adder 44 provides a zero as the output. This is consistent with the inputs X1 and X2, which are minus 1 and plus 1, respectively, adding to zero.

For a different example, assume X1 is −0.5 and X2 is 0.8, the output of adder 16 is −0.5+0.8−(−0.4)=0.3+0.4=0.7, and the output of adder 18 is −(−0.5)−0.8−(−0.4)=−0.3+0.4=0.1 Adder 24 then provides an output of 0.7−0.1 which equals 0.6.

For an example where the summation of X1 and X2 exceeds one, X1 is minus 0.8 and X2 is minus 0.5. This is a simple summation of minus 1.3. Using mixing kernel 10, the output of adder 16 is −0.8−0.5−(−0.5)(−0.8)=−1.7, and the output of adder 18 is −(−0.8)−(−0.5)−(−0.8)(−0.5)=0.9. Because the value provided by adder 16 is negative, it is discarded. Adder 24 then receives zero on its adding input and 0.9 on its negating input so provides −0.9 as the value of signal M. As can be seen then, even though the straight sum of X1 and X2 has an absolute value greater than one, the value produced as signal M for transmission is within the dynamic range for transmission. The primary effect is that the signal is compressed near the clipping range.

Figure 2:
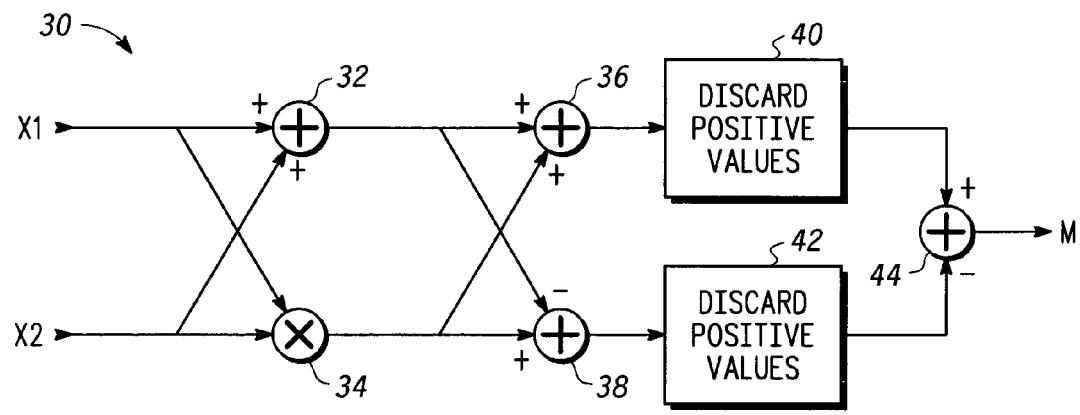
FIG. 2 is a circuit diagram of a mixing kernel according to another embodiment.

Shown in FIG. 2 is a mixing kernel 30 comprising an adder 32, a multiplier 34, an adder 36, an adder 38, a discard positive values circuit 40, a discard positive values circuit 42, and an adder 44. Mixing kernel 30 is an alternative to mixing kernel 10 for mixing signals X1 and X2 and providing signal M. Adder 32 has an adding input for receiving signal X1, an adding input for receiving signal X2, and an output. Multiplier 34 has an input for receiving signal X1, an input for receiving signal X2, and an output. Adder 36 has an adding input coupled to the output of adder 32, an adding input coupled to the output of multiplier 34, and an output. Adder 38 has a negating input coupled to the output of adder 32, an adding input coupled to the output of multiplier 34, and an output. Discard positive values circuit 40 has an input coupled to the output of adder 36 and has an output. Discard positive values circuit 42 has an input coupled to the output of adder 38 and has an output. Adder 44 has an adding input coupled to the output discard positive values circuit 40, a negating input coupled to the output of discard positive values circuit 42, and an output that provides a mixed signal M.

In operation, adder 32 provides an intermediate result on its output of X1 plus X2;

X1+X2.

Multiplier 34 provides an intermediate result on its output of X1 times X2;

X1X2.

Adder 36 thus provides an intermediate result on its output of X1 plus X2 plus X1 times X2;

X1+X2+X1X2.

Adder 38 provides an intermediate result on its output of minus X1 minus X2 plus X1 times X2;

−X1−X2+X1X2.

Discard positive values circuits 40 and 42 operate similarly to discard negative values circuits 20 and 22. Discard positive values circuit 40 couples the output of adder 36 to the adding input 44 if it is negative and otherwise couples zero to adder 44. Similarly, discard positive values circuit 42 couples the output of adder 38 to the negating input of adder 44 if its output is negative and otherwise couples a zero to adder 44. This can be viewed as multiplying the input by a step function of the negating input. Accordingly, discard positive values circuits 40 and 42 each include a step function circuit. For example, if X1 is plus 1 and X2 is minus one, then the output of adder 36 is 1−1+(−1)1=−1, which is negative, and is coupled to the adding input of adder 44, and the output of adder 38 is −(−1)−1+(−1)1=−1, which is negative, and is coupled to the negating input of adder 44. With the adding input and negating input of adder 24 both at negative 1, adder 44 provides a zero as the output. This is consistent with the inputs X1 and X2, which are minus 1 and plus 1, respectively, adding to zero.

For an example where the summation of X1 and X2 exceeds one, X1 is minus 0.8 and X2 is minus 0.5. This is a simple summation of minus 1.3. Using mixing kernel 30, the output of adder 36 is −0.8−0.5+(−0.5)(−0.8)=−0.9, and the output of adder 38 is −(−0.8)−(−0.5)+(−0.8)(−0.5)=1.7. Because the value provided by adder 38 is positive, it is discarded. Adder 44 then receives zero on its negating input and −0.9 on its positive input so provides −0.9 as the value of signal M. As can also be seen then for mixing kernel 30, even though the straight sum of X1 and X2 has an absolute value greater than one, the value produced as signal M for transmission is within the dynamic range for transmission.

Figure 3:
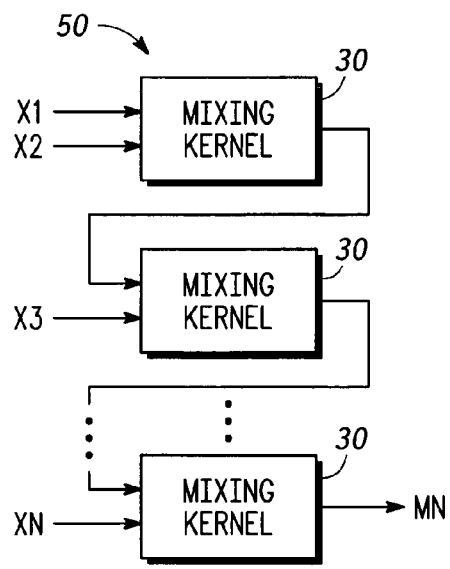
FIG. 3 is a circuit diagram of a mixer using the mixing kernel of either FIG. 1 or FIG. 2.

Shown in FIG. 3 is a signal mixer 50 comprising three mixing kernels such as mixing kernel 30 from FIG. 2 and additional mixing kernels as needed. This shows that the output of a mixing kernel 30 or mixing kernel 10 can be mixed with another signal to produce another mixed signal that is bounded according to the dynamic range of the channel over which the output signal MN will be transmitted. There are situations where it is desirable to mix more than two signals. This shows there is actually no limit to the number of signals that can be mixed. Of course there may be other practical limitations as to how many can actually beneficially be combined. For example in a telephone conference involving many different remote locations, only so many can talk at once and there be benefit in doing so. Another alternative (not shown) is to have signals X1-XN each input to a kernel mixer and then have the kernel mixer outputs go to other kernel mixer inputs. In such case, kernel mixer outputs would be mixed together rather than a kernel mixer output mixed with one of signals X1-XN. In addition, the various inputs can be the same signal.

This is particularly relevant in the situation in which a particular signal to noise ratio is to be obtained by amplifying the signal. The noise level can vary and in some situations become quite high. In such cases, the calculated gain for the desired signal to noise ratio can be so high that it would result in transmitting a signal that would exceed the dynamic range of the channel. For example a gain factor of three may exceed the dynamic range of the channel to be transmitted on. If the signal X1 is to be amplified by a factor of three, both inputs of a first kernel mixer such as kernel mixer 10 or 30 would receive signal X1, the first kernel mixer would provide an output that would be mixed with X1 in second kernel mixer, and the second kernel mixer would then provide the amplified output for transmission. This would ensure that the transmitted signal was bounded to avoid exceeding the dynamic range of the channel and the consequent clipping. If the number to be amplified is not a simple integer such as 3.5, the extra 0.5 would be achieved by mixing once with a signal that is 0.5X1 in addition to what is required to achieve the integer mixes.

Figure 4:
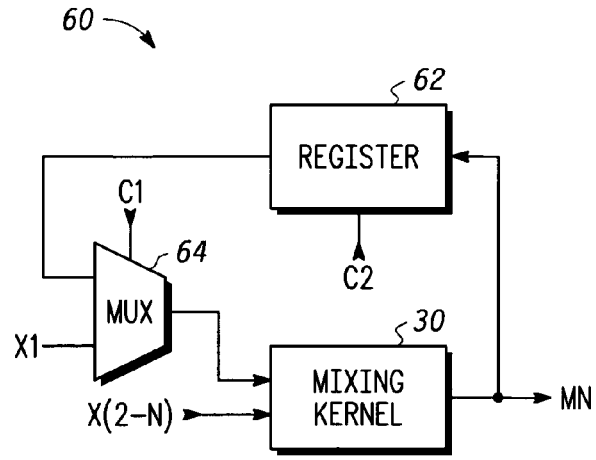
FIG. 4 is a circuit diagram of a mixer using the mixing kernel of FIG. 1 or FIG. 2.

Shown in FIG. 4 is an alternative to signal mixer 50 comprising a mixing kernel 30, a register 62, and a multiplexer 64. Multiplexer 64 has a first signal input for receiving signal X1, a second signal input, a control input for receiving a control signal C1, and an output. Mixing kernel 30 has an input coupled to the output of multiplexer 64, an input for receiving one of signals X(2-N), and an output for providing an output signal MN. Register 62 has a signal input coupled to the output of mixing kernel 30, a control input for receiving signal C2, and an output coupled to the second signal input of multiplexer 64. In operation multiplexer first couples signal X1 to mixing kernel 30 and receives signal X2 to generate a mixed output that is stored in register 62. Multiplexer 64 then couples the output of register 62 to mixing kernel 30 so that mixing kernel 30 then mixes signal X3 with the output of register 62. At this point register 62 is storing the result of mixing signals X1, X2, and X3. Signal X4 is then mixed by mixing kernel 30 with the output of register 62 to produce a mixed signal as a mix of signals X(1-4). This continues until signal XN, N being the number of signals to be mixed, has been mixed with the output of register 62 to produce signal MN. The number of signals is not limited mixing kernel 30. The limit would be based on other considerations such as was described relative to signal mixer 50 of FIG. 3.

Also signal mixer 60 can be used for the case of mixing in response to a desired gain factor, which as stated previously as an example, may occur when a desired signal to noise ratio is being attempted but in which the channel may not have sufficient dynamic range for the desired gain factor. In such case signal X1 would be placed on the input kernel mixer 30 that is shown as receiving signals X(2-N). The number of mixes would be controlled by signals C1 and C2 and others to obtain signal MN. For gains that have a fraction in addition to an integer such as 3.5, one of the inputs is 0.5X1.

Various changes and modifications to the embodiments herein chosen for purposes of illustration will readily occur to those skilled in the art. For example, other functional circuits may used to implement various features than those disclosed. Additionally other uses of a mixing kernel may be implemented as well as other benefits than those disclosed may arise. To the extent that such modifications and variations do not depart from the spirit of the invention, they are intended to be included within the scope thereof which is assessed only by a fair interpretation of the following claims.

What is claimed is:

1. A signal mixer for mixing a plurality of signals comprising:
    a first adder having a first input for receiving a first signal sample and a second input for receiving a second signal sample to provide a first intermediate result;
    a multiplier for multiplying the first signal sample with the second signal sample to provide a second intermediate result;
    a second adder having a first input for receiving the second intermediate result and a second input for receiving the first intermediate result to obtain a third intermediate result that is zero or has a sign comprising one of a group consisting of a first sign and a second sign;
    a third adder having a first input for receiving the first intermediate result and a second input for receiving the second intermediate result to provide a fourth intermediate result that is zero or has a sign comprising one of a group consisting of the first sign and the second sign;
    a first step function circuit for discarding the third intermediate result if the sign of the third intermediate result is the first sign;
    a second step function circuit for discarding the fourth intermediate result if the sign of the fourth intermediate result is the first sign;
    and a first circuit for providing an output signal sample based on the third intermediate result if the sign of the third intermediate result is the second sign and on the fourth intermediate result if the sign of the fourth intermediate result is the second sign.

2. The signal mixer of claim 1, wherein the first input of the second adder is an adding input, the second input of the second adder is a negating input, the first input of the third adder is a negating input, and the second input of the third adder is a negating input.

3. The signal mixer of claim 1, wherein the signal mixer is used for increasing a gain of a sampled signal by a predetermined gain G, where a sampled signal is provided as the first signal sample N number of iterations, where N is an integer, and a resulting output signal sample from each iteration being provided as the second signal sample.

4. A method for mixing a plurality of signals comprising:
    sampling a first signal to provide a first signal sample and sampling a second signal to provide a second signal sample;
    adding, by a first adder, the first signal sample to the second signal sample to obtain a first intermediate result;
    multiplying, by a multiplier, the first signal sample with the second signal sample to obtain a second intermediate result;
    subtracting, by a subtractor, the second intermediate result from the first intermediate result to obtain a third intermediate result;
    discarding, by a first step function circuit, the third intermediate result if the third intermediate result is less than zero;
    providing, by a first output circuit, an output signal sample based on the third intermediate result if the third intermediate result is greater than zero;
    changing a sign of each of the first and second intermediate results;
    adding, by a second adder, the changed sign first and second intermediate results to obtain a fourth intermediate result;
    discarding, by a second step function circuit, the fourth intermediate result if the fourth intermediate result is less than zero; and
    combining, by a second output circuit, the third and fourth intermediate results to generate the output signal sample.

5. The method of claim 4, wherein combining the third and fourth intermediate results further comprises subtracting the fourth intermediate result from the third intermediate result.

6. The method of claim 4, wherein discarding the third intermediate result further comprises setting the third intermediate result to zero.

7. The method of claim 4, wherein the method is implemented in a software kernel on a data processing system.

8. The method of claim 7, wherein the plurality of signals are sampled and mixed by recursively running the software kernel on the plurality of signal samples.

9. The method of claim 4, wherein the plurality of signals are sampled and mixed using a plurality of mixers, wherein an input of one of the plurality of mixers is coupled to an output of another one of the plurality of mixers.

10. The method of claim 4, wherein the method is implemented to increase a gain of a sampled signal by a predetermined gain G, where the sampled signal is provided as the first signal sample N number of times, where N is an integer, and a resulting output signal sample from each iteration being provided as the second signal sample.

11. The method of claim 4, wherein the first and second signals are digital audio signals.

12. A method for mixing a plurality of signals comprising:
    sampling a first signal to provide a first signal sample and sampling a second signal to provide a second signal sample;
    adding, by a first adder, the first signal sample to the second signal sample to obtain a first intermediate result;
    multiplying, by a multiplier, the first signal sample with the second signal sample to obtain a second intermediate result;
    adding, by a second adder, the second intermediate result to the first intermediate result to obtain a third intermediate result;
    discarding, by a first step function circuit, the third intermediate result if the third intermediate result is greater than zero;

providing, by a first output circuit, an output signal sample based on the third intermediate result if the third intermediate result is less than zero;

subtracting, by a subtractor, the first intermediate result from the second intermediate result to obtain a fourth intermediate result;

discarding, by a second step function circuit, the fourth intermediate result if the fourth intermediate result is greater than zero; and combining, by a second output circuit, the third and fourth intermediate results to generate the output signal sample.

13. The method of claim 12, wherein combining the third and fourth intermediate results further comprises subtracting the fourth intermediate result from the third intermediate result.

14. The method of claim 12, wherein discarding the third intermediate result further comprises setting the third intermediate result to zero.

15. The method of claim 12, wherein the method is implemented in a software kernel on a data processing system and first and second signals are digital audio signals.

16. The method of claim 15, wherein the plurality of signals are sampled and mixed by recursively running the software kernel on the plurality of signal samples.

17. The method of claim 12, wherein the plurality of signals are sampled and mixed using a plurality of mixers, wherein an input of one of the plurality of mixers is coupled to an output of another one of the plurality of mixers.

18. The method of claim 12, wherein the method is implemented to increase a gain of a sampled signal by a predetermined gain G, where the sampled signal is provided as the first signal sample N number of times, where N is an integer, and the resulting output signal sample from each iteration being provided as the second signal sample.

19. The signal mixer of claim 2, wherein the first sign is negative.

20. The signal mixer of claim 1, wherein the first input and the second input of the second adder are adding inputs, the first input of the third adder is a negating input, and the second input of the third adder is an adding input.

21. The signal mixer of claim 20, wherein the first sign is positive.

22. The signal mixer of claim 1, wherein the first circuit subtracts the fourth intermediate signal from the third intermediate signal to provide the output signal sample if the sign of both the third intermediate signal and the fourth intermediate signal is the second sign.

* * * * *